(12) United States Patent
Takata

(10) Patent No.: US 6,594,777 B1
(45) Date of Patent: Jul. 15, 2003

(54) SEMICONDUCTOR MEMORY DEVICE

(75) Inventor: Hidekazu Takata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/505,514

(22) Filed: Feb. 17, 2000

(30) Foreign Application Priority Data

Mar. 26, 1999 (JP) .......................................... 11-082779

(51) Int. Cl.⁷ .............................................. G06F 11/00
(52) U.S. Cl. ........................... 714/5; 365/200; 711/102
(58) Field of Search ................ 714/5–8, 710; 711/102

(56) References Cited

U.S. PATENT DOCUMENTS

| | | | |
|---|---|---|---|
| 5,109,505 A | * 4/1992 | Kihara | 714/5 |
| 5,179,536 A | * 1/1993 | Kasa et al. | 365/200 |
| 5,454,100 A | * 9/1995 | Sagane | 714/8 |
| 5,457,791 A | * 10/1995 | Matsumoto et al. | 714/5 |
| 5,758,056 A | * 5/1998 | Barr | 714/7 |
| 5,841,961 A | * 11/1998 | Kozaru et al. | 365/149 |
| 5,859,960 A | * 1/1999 | Kurihara et al. | 714/7 |
| 6,158,018 A | * 12/2000 | Bernasconi et al. | 714/8 |
| 6,240,486 B1 | * 5/2001 | Ofek et al. | 711/112 |

FOREIGN PATENT DOCUMENTS

| | | |
|---|---|---|
| EP | 0092646 A1 | 11/1983 |
| EP | 0686980 A1 | 12/1995 |
| JP | 06103056 | 4/1994 |
| JP | 07129397 | 5/1995 |

* cited by examiner

Primary Examiner—Robert Beausoliel
Assistant Examiner—Christopher S. McCarthy
(74) Attorney, Agent, or Firm—Morrison & Foerster LLP

(57) ABSTRACT

A semiconductor device includes: a read-only semiconductor memory device; and a nonvolatile semiconductor memory device for replacing defective data in at least one defective region which occurred in the read-only semiconductor memory device with modification data for modifying the defective data, the nonvolatile semiconductor memory device including: a memory section capable of electrically writing address data indicating an address of the defective region, and the modification data; and an address determination circuit for outputting a determination result signal which inactivates the read-only semiconductor memory device when the address data matches an address provided from outside the semiconductor memory device, wherein the nonvolatile semiconductor memory device reads and outputs the modification data from the memory section when the address data matches the address.

16 Claims, 10 Drawing Sheets

SEMICONDUCTOR MEMORY DEVICE

BACKGROUND OF THE INVENTION

1. Field of the Invention

The present invention relates to a device for replacing the information in a read-only semiconductor memory device, and more specifically, the present invention relates to a semiconductor memory device which employs a nonvolatile semiconductor memory device for enabling the repair or update of an unrewritable memory device used in game machines, mobile terminals, and the like.

2. Description of the Related Art

Japanese Laid-open Publication No. 7-129396 proposes the following patch method in a read-only memory device for modifying the read-only memory device, in which modification data is pre-stored in a rewritable memory device, and then defective data which is read from the read-only memory device is artificially modified by using the modification data.

Japanese Laid-open Publication No. 6-103056 describes a memory device including a selector for replacing defective data, when the defective data is read, with alternative data.

The conventional patch methods described above, however, have the following problems: a high-speed operation is not possible because the defective data is modified after it is read from the read-only memory device (Japanese Laid-open Publication No. 7-129396) or a selector is used for replacing defective data with modification data after the defective data is read (Japanese Laid-open Publication No. 6-103056); updating of modification data is impossible; and power consumption is significant because the read-only memory device is activated not only when correct data is read but when defective data is read.

SUMMARY OF THE INVENTION

A semiconductor device according to the present invention includes: a read-only semiconductor memory device; and a nonvolatile semiconductor memory device for replacing defective data in at least one defective region which occurred in the read-only semiconductor memory device with modification data for modifying the defective data, the nonvolatile semiconductor memory device including: a memory section capable of electrically writing address data indicating an address of the defective region, and the modification data; and an address determination circuit for outputting a determination result signal which inactivates the read-only semiconductor memory device when the address data matches an address provided from outside the semiconductor memory device, wherein the nonvolatile semiconductor memory device reads and outputs the modification data from the memory section when the address data matches the address.

In one embodiment of the invention, the memory section includes: an address data storage region for storing the address data; and a modification data storage region for storing the modification data.

In another embodiment of the invention, the semiconductor memory device further includes a data processing device-connected to an output of the read-only semiconductor memory device and an output of the nonvolatile semiconductor memory device.

In still another embodiment of the invention, the determination result signal is output outside the device.

In still another embodiment of the invention, the semiconductor memory device further includes at least one modification data storing region and at least one address data storing region.

In still another embodiment of the invention, the semiconductor memory device further includes a circuit for protecting the modification data storing region.

In still another embodiment of the invention, the circuit for protecting the modification data storing region releases the protection of the modification data storing region when a voltage higher than a supply voltage is applied as an external input signal.

In still another embodiment of the invention, the nonvolatile semiconductor memory device further includes a circuit for protecting the address data storing region.

In still another embodiment of the invention, the circuit for protecting the address data storing region releases the protection of the address data storing region when a voltage higher than a supply voltage is applied as an input signal from outside.

In still another embodiment of the invention, the nonvolatile semiconductor memory device further includes a resister for storing the address data read from the memory section in response to an input of a read command.

In still another embodiment of the invention, the read-only semiconductor memory device and the nonvolatile semiconductor memory device are each formed of a single-chip LSI.

In still another embodiment of the invention, the read-only semiconductor memory device and the non volatile semiconductor memory device are each formed of a single-chip LSI and are enclosed in a same package.

According to the semiconductor memory device of the present invention, a nonvolatile semiconductor memory device is employed when defective data occurs or modifying data is updated. The nonvolatile semiconductor device includes a modification data storing region and an address data storing region in its memory section, which enable one to store modification data and address data. Defective data can be automatically replaced with modifying data based on the stored address data when the address of the defective region to be replaced is input, and the read-only semiconductor memory device can be inactivated for outputting modified data only.

Thus, the invention described herein makes possible the advantages of providing (1) a semiconductor device which is capable of replacing defective data with modified data at a high speed: (2) a semiconductor device which is capable of inactivating the read-only semiconductor device when defective data is being replaced with modification data; (3) a semiconductor device which is capable of updating the modifying data when the read-only semiconductor device is modified.

These and other advantages of the present invention will become apparent to those skilled in the art upon reading and understanding the following detailed description with reference to the accompanying figures.

DESCRIPTION OF THE PREFERRED EMBODIMENTS

The present invention will now be described in detail with reference to the accompanying drawings.

EXAMPLE 1

A first example of the present invention will now be described with reference to the accompanying drawings.

Figure 1:
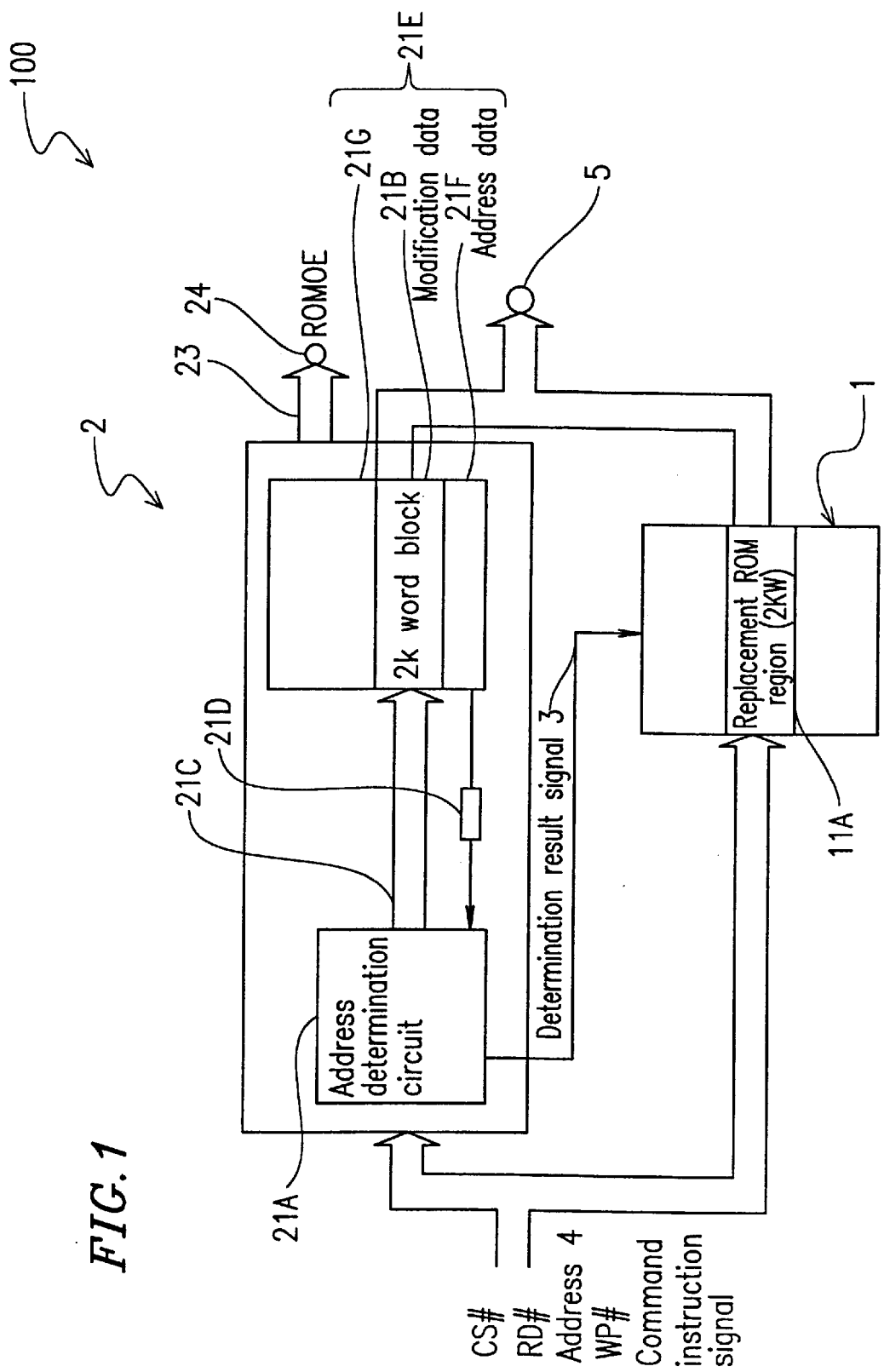
FIG. 1 is a block diagram showing a first exemplary configuration of a semiconductor memory device according to the present invention.

FIG. 1 is a block diagram showing a first exemplary configuration of a semiconductor memory device according to the present invention.

Semiconductor device 100 of Example 1 includes a read-only semiconductor memory device (a mask ROM) 1, which is not rewritable, and a nonvolatile semiconductor memory device (a flash memory device) 2, which is writable/erasable. Activate signal CS#, read signal RD#, address 4, protect signal WP# and a command instruction signal are externally input to semiconductor device 100.

Nonvolatile semiconductor memory device 2 includes a memory section 21E which is electrically writable/erasable, a resister 21D, and an address determination circuit 21A. Memory section 21E is specifically a flash memory, having flash memory cells formed in matrix for enabling electrical writing/erasing. Mask ROM 1 has a replacement ROM region 11A for storing defective data requiring a modification. Memory section 21E includes an address data storing region 21F for storing address data of replacement ROM region 11A, a modifying data (ROM patch) storing region 21B for storing modifying data which modifies defective data, and a data storage region 21G for storing other data.

With reference to FIG. 1, when a defect occurs in read-only semiconductor memory device 1 and replacement ROM region 11A which stores the defective data is created, address data representing replacement ROM region 11A is stored in address storing region 21F. Modification data for modifying defective data in replacement ROM region 11A is then stored in modification data storing region 21B. As the method for storing, write instruction is sent to nonvolatile semiconductor memory device 2, then each of the data is stored in address data storing region 21F and modification data storing region 21B of memory section 21E, respectively.

Figure 2:
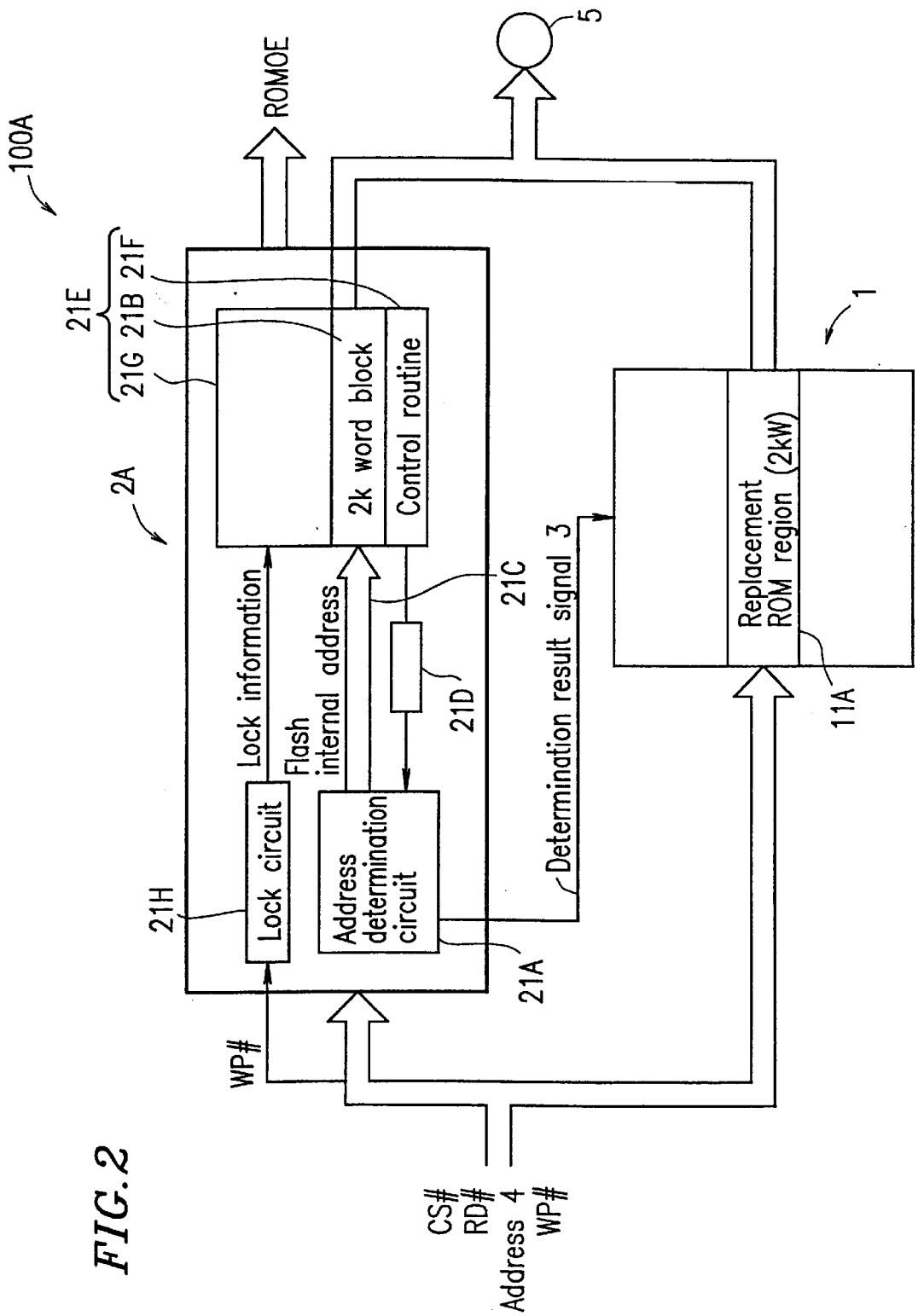
FIG. 2 is a block diagram showing a configuration variation of the semiconductor memory device in FIG. 1, which further includes a lock circuit in the nonvolatile semiconductor memory device.

Nonvolatile semiconductor memory device 2 also has a protection function for preventing accidental rewritings of address data written in address data storing region 21F and modification data written in modification data storing region 21B. By locking in response to instructions from outside (e.g. a lock by a command or by external input signal WP#), the protection function inhibits a rewrite, and protects data. Changing address data and modification data is possible, depending on external commands or signals, even after address data and modification data are stored in address data storing region 21F and modification data storing region 21B. Nonvolatile semiconductor memory device 2 also has a function for releasing the protection in order to change the contents of address data storing region 21F and modification data storing region 21B. The protection function is released when a voltage applied at external input signal WP# is higher than a supply voltage VCC. Change is possible only when the protection function is released. More specifically, as shown in semiconductor device 100A in FIG. 2, nonvolatile semiconductor memory device 2A is provided with a lock circuit 21H for outputting lock information to memory section 21B, thus enabling memory section 21E to perform protection/release.

When a read command instruction is sent to nonvolatile semiconductor memory device 2, address data is read from address data storing region 21F and transmitted to resister 21D. Address determination circuit 21A compares address data written in resister 21D with address 4 input externally, for outputting determination result signal 3. Determination result signal 3, indicating either H level or L level is output from address determination circuit 21A and input to read-only semiconductor memory device 1. Based on determination result signal 3, read-only semiconductor memory device 1 determines whether it should output data or inhibit the output. If address data written in resister 21D matches address 4 input externally, data read from read-only semiconductor memory device 1 is inhibited from outputting. Instead, address determination circuit 21A provides internal flash address 21C to memory section 21E of nonvolatile semiconductor memory device 2, then internal flash address 21C reads modification data stored in modification data storing region 21B, for outputting modified data to data output terminal 5.

Figure 3:
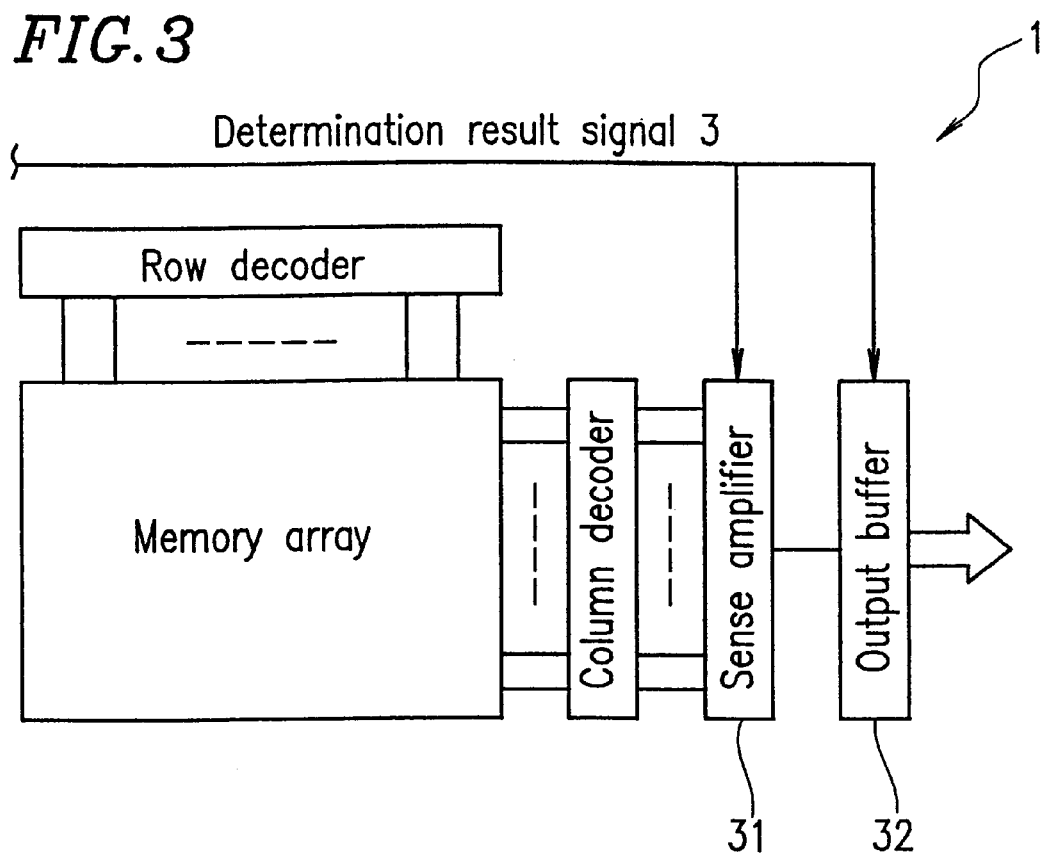
FIG. 3 is a block diagram showing an internal configuration of a read-only semiconductor memory device of the semiconductor memory device in FIG. 1.

More specifically, read-only semiconductor memory device 1 is inactivated based on determination result signal 3. As a method for inactivation, for example, sense amplifier 31 and output buffer 32 (FIG. 3) are inactivated so as to inhibit data output from read-only semiconductor memory device 1. Output buffer 32 usually consumes a lot of power since it requires having a high driving potential. According to the present invention, however, it is possible to reduce the power consumption because output buffer 32 of read-only semiconductor memory device 1 is inactivated when address data written in resister 21D matches address 4 input externally. FIG. 3 shows a configuration example in this case. When address data written in resister 21D do not match address 4 input externally, data read from read-only semiconductor memory device 1 is output to data output terminal 5.

Figure 4:
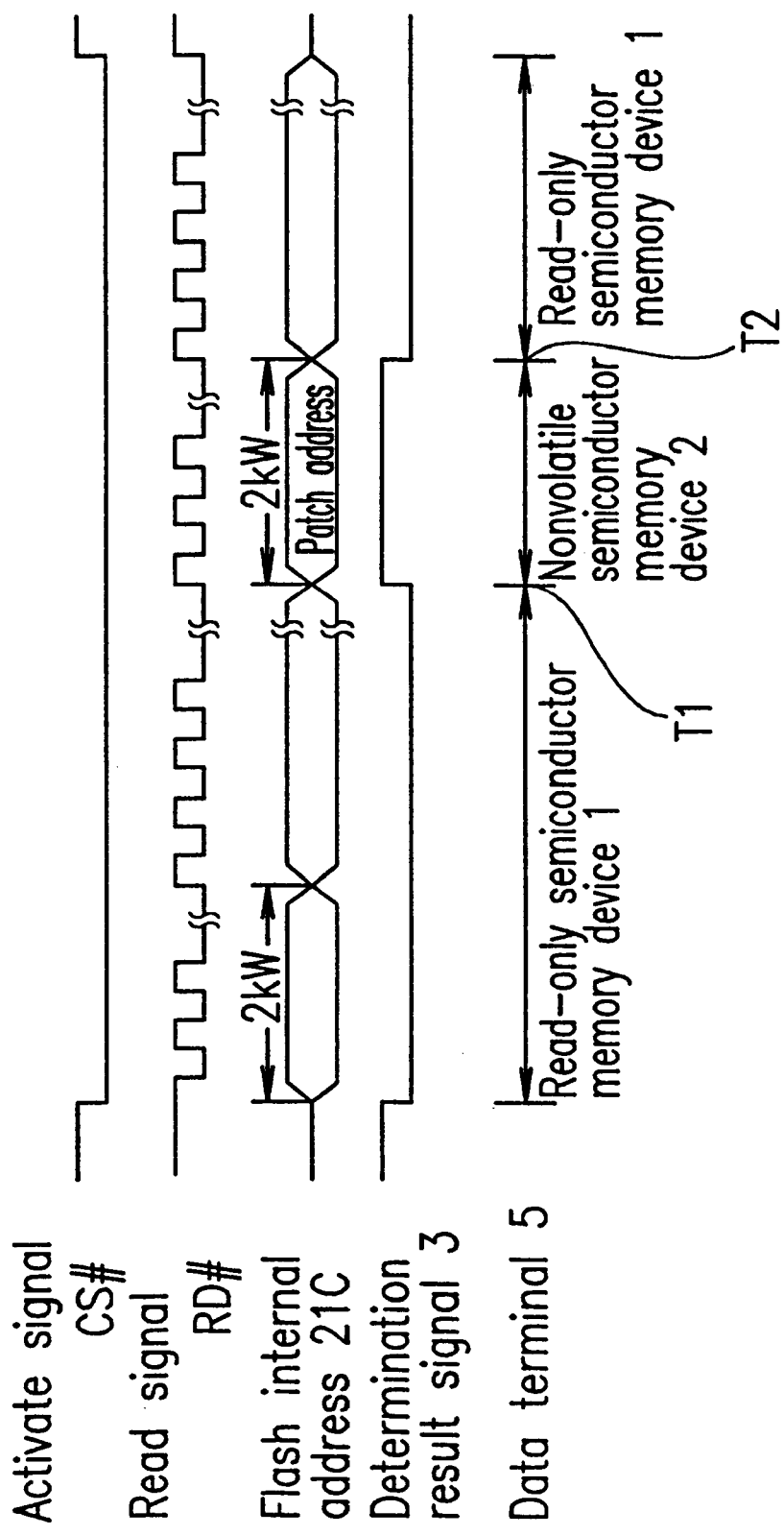
FIG. 4 is an operation timing diagram of the example in FIG. 1.

Operation timings for replacing defective data stored in read-only semiconductor memory device 1 with modification data stored in nonvolatile semiconductor memory device 2 will now be described with reference to FIG. 4. CS# represents a signal for activating both the semiconductor memory devices, and RD# represents a read signal for executing reading. As described above, address data has already been sent from address data storing region 21F to resister 21D, in response to a read command instruction given to nonvolatile semiconductor memory device 2. The read command instruction is executed at least once when the power is turned on. In this example of operation timing, read-only semiconductor memory device 1 reads the sequentially,stored data in response to the rise of signal RD# when CS# is in "low" state. The replacement of defective data with modification data starts in response to the rise of determination result signal 3 and RD# (time T1). When the replacement is completed, read-only semiconductor memory device 1 is again activated in response to the rise of determination result signal 3 and RD# (time T2), then reading from read-only semiconductor memory device 1 is recommenced. Data may be read in response to the fall of RD#. Other operation timing is applicable to the present invention as long as defective data is replaced with modification data when the level of determination result signal 3 is changed. Accordingly, when an address corresponding to the defective region of read-only semiconductor memory device 1 is externally input, semiconductor device 100 of the present invention makes it possible to replace defective data which occurs in a defective region (replacement ROM region 11A) with modification data stored in modification data storing region 21B of memory section 21E and then to output a modified data.

Although the size of replacement ROM region 11A and modification data storing region 21B each is 2 k in this example, the size of these regions can vary.

Semiconductor device 100 of this example further includes a device for informing an external device of the completion of the replacement. For example, output terminal 24 is provided for outputting ROMOE signal 23 outside the device 100 when the replacement is executed by nonvolatile semiconductor memory device 2. ROMOE signal 23 is determination result signal 3 sent from address determination circuit 21A described above. For outputting ROMOE signal 23 outside the device 100, other methods may be used instead of providing output terminal 24. For example, a device for reading status information (data on I/O terminal), which is commonly provided on a flash memory and the like, can be used.

EXAMPLE 2

A second example of the present invention will now be described.

Figure 5:
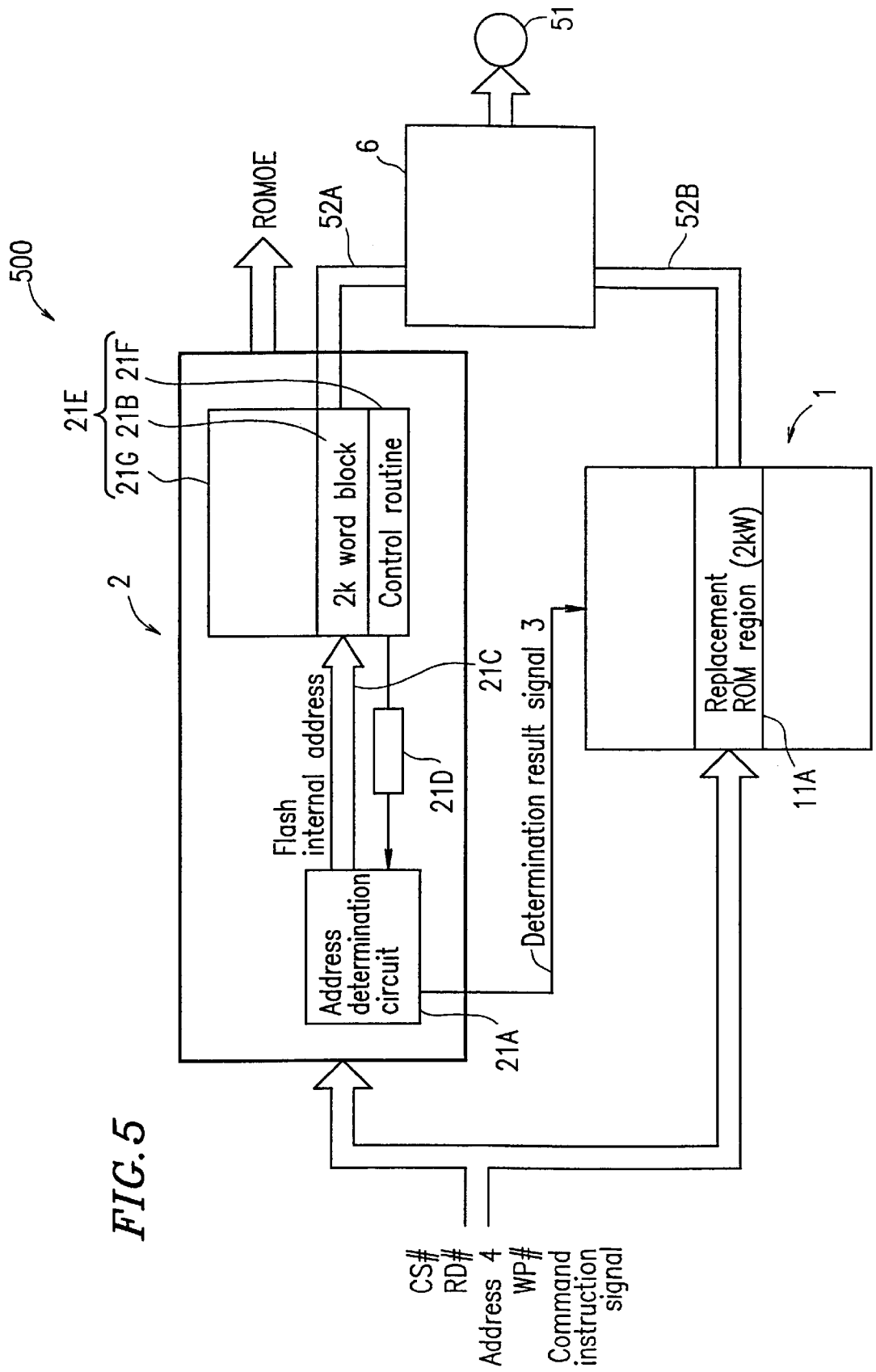
FIG. 5 is a block diagram showing a second exemplary configuration of the present invention.

FIG. 5 is a block diagram showing semiconductor device 500 according to the second example of the present invention. In semiconductor device 500, data output 52B of read-only semiconductor memory device 1 and data output 52A of rewritable nonvolatile semiconductor memory device 2 is connected via semiconductor device 6. In this example, the following operation similar to the operation in Example 1 is carried out. There is no data output 52B when a replacement is done in response to determination result signal 3, and then data on data output 52A alone is output. Thus, semiconductor device 6 processes data output 52A only. Semiconductor device 6 is, for example, a CPU, which processes the data read from read-only semiconductor memory device 1 or nonvolatile semiconductor memory device 2. The processing result of the semiconductor device 6 is output to data output terminal 51.

EXAMPLE 3

A third example of the present invention will now be described.

Figure 6A:
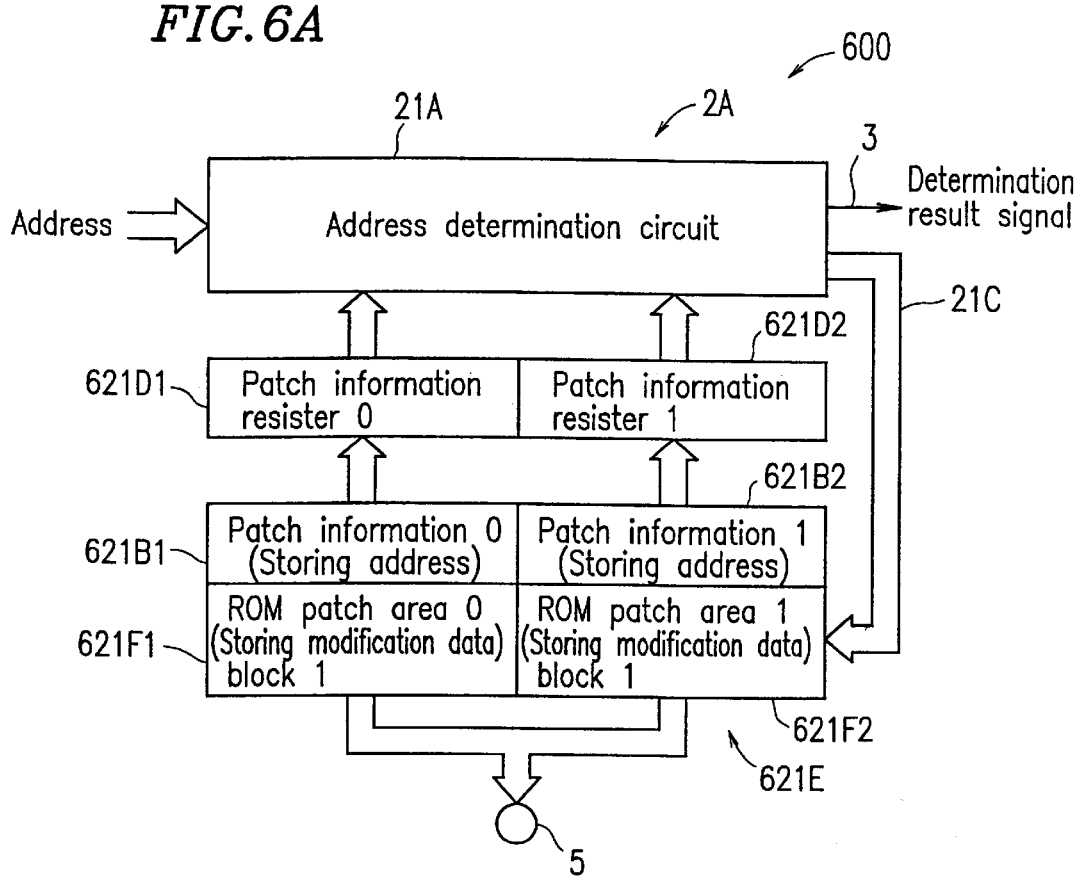
FIG. 6A is a block diagram showing a nonvolatile semiconductor memory device used in a third exemplary configuration of a semiconductor memory device according to the present invention.
Figure 6B:
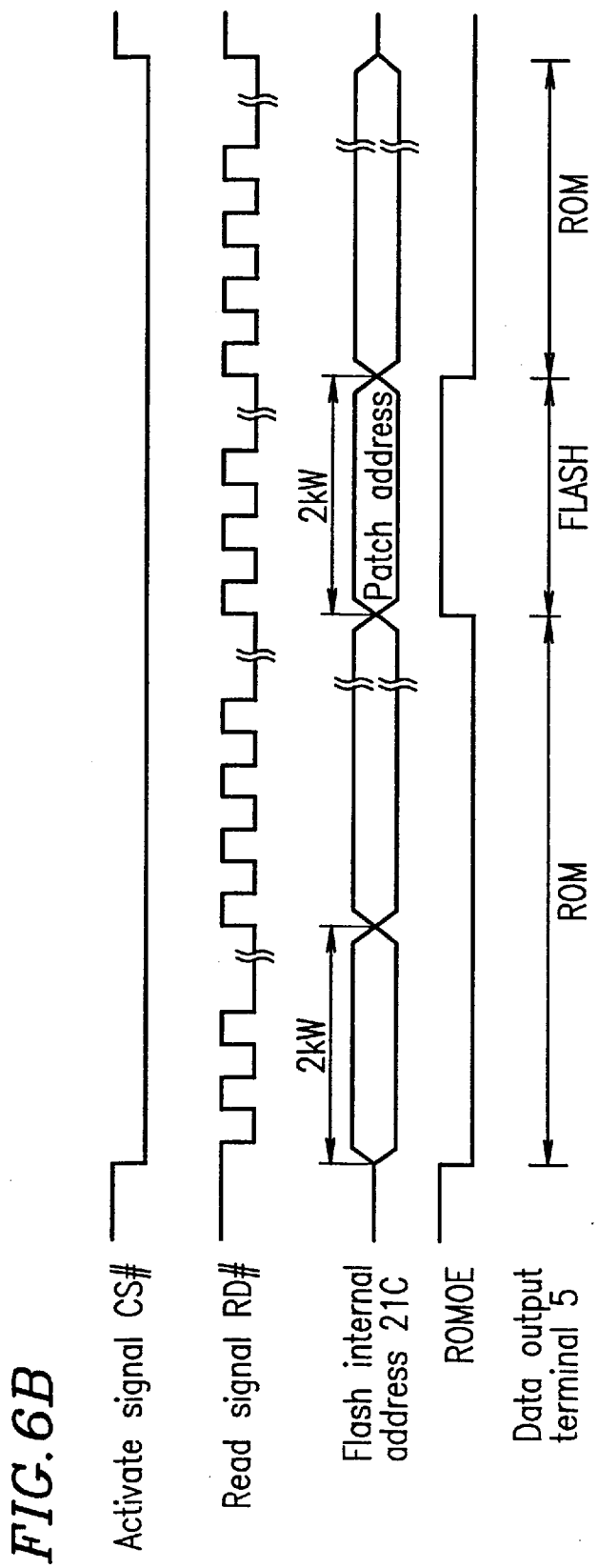
FIG. 6B is an operation timing diagram of the example in FIG. 6A.

FIGS. 6A and 6B are diagrams showing semiconductor device 600 according to the third example of the present invention. FIG. 6A is a block diagram of nonvolatile semiconductor memory device 2A, and FIG. 6B is an operation timing diagram of nonvolatile semiconductor memory device 2A shown in FIG. 6A. In this example, memory section 621B includes two modification data storing regions 621B1 and 621B2, and two address data storing regions 621F1 and 621F2. Even when two pieces of defective data occur in read-only semiconductor memory device (not shown), both pieces of defective data can be replaced with modification data. In this example, semiconductor device 600 also includes two resisters 621D1 and 621D2.

Figure 7:
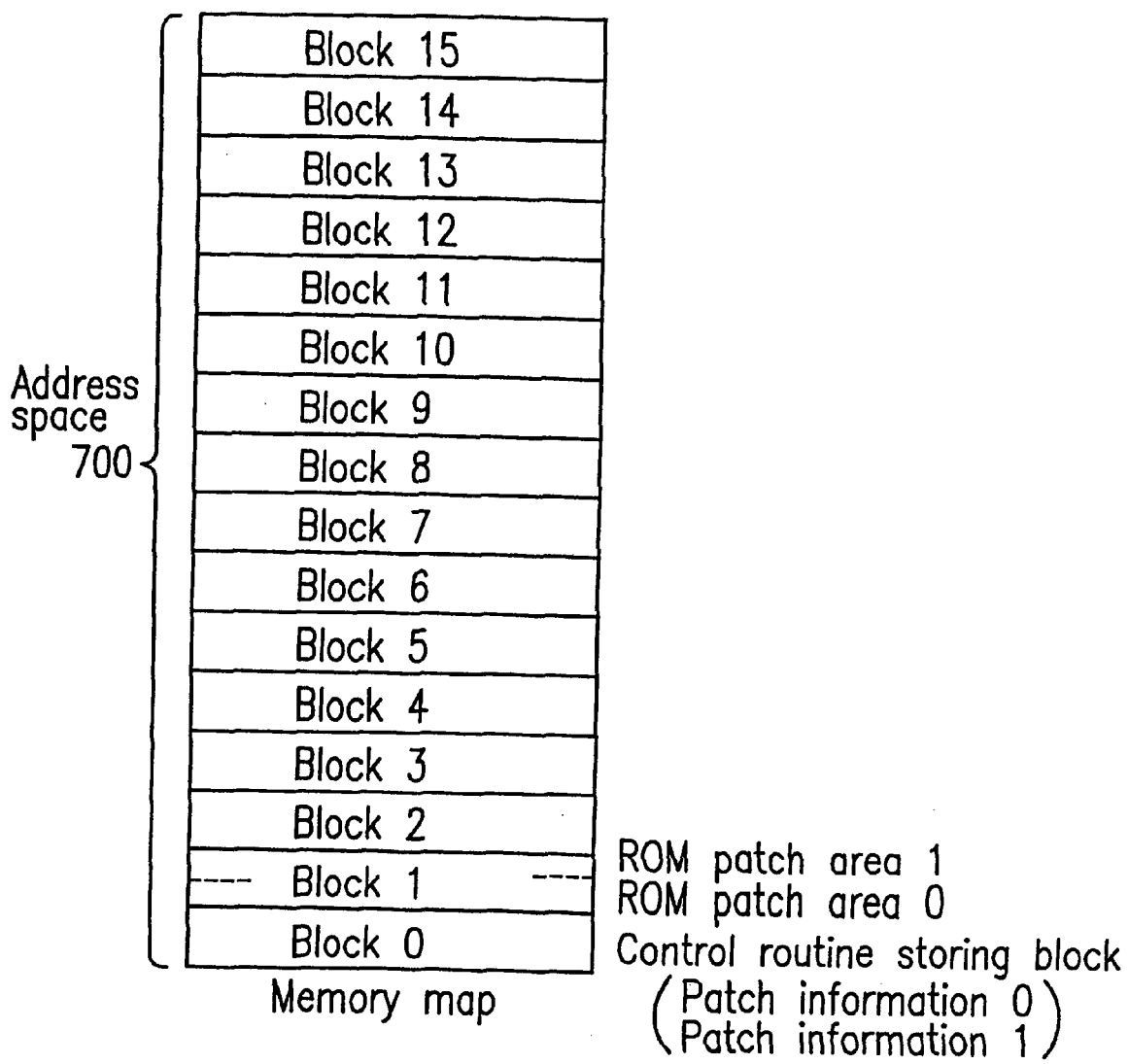
FIG. 7 is a memory map of the example in FIG. 6A.

FIG. 7 is a memory map of Example 3. Blocks 0 through 15 are allocated in address space 700. The regions in block 0 correspond to regions 621F1, 621F2, in which patch information 0 and patch information 1 (both of them are address data) are stored. The regions in block 1 correspond to region 621B1 including ROM patch region 0 and region 621B2 including ROM patch region 1, each storing a piece of modification data. Rests of the blocks 2 through 15 store other data.

EXAMPLE 4

A fourth example of the present invention will now be described.

Figure 8A:
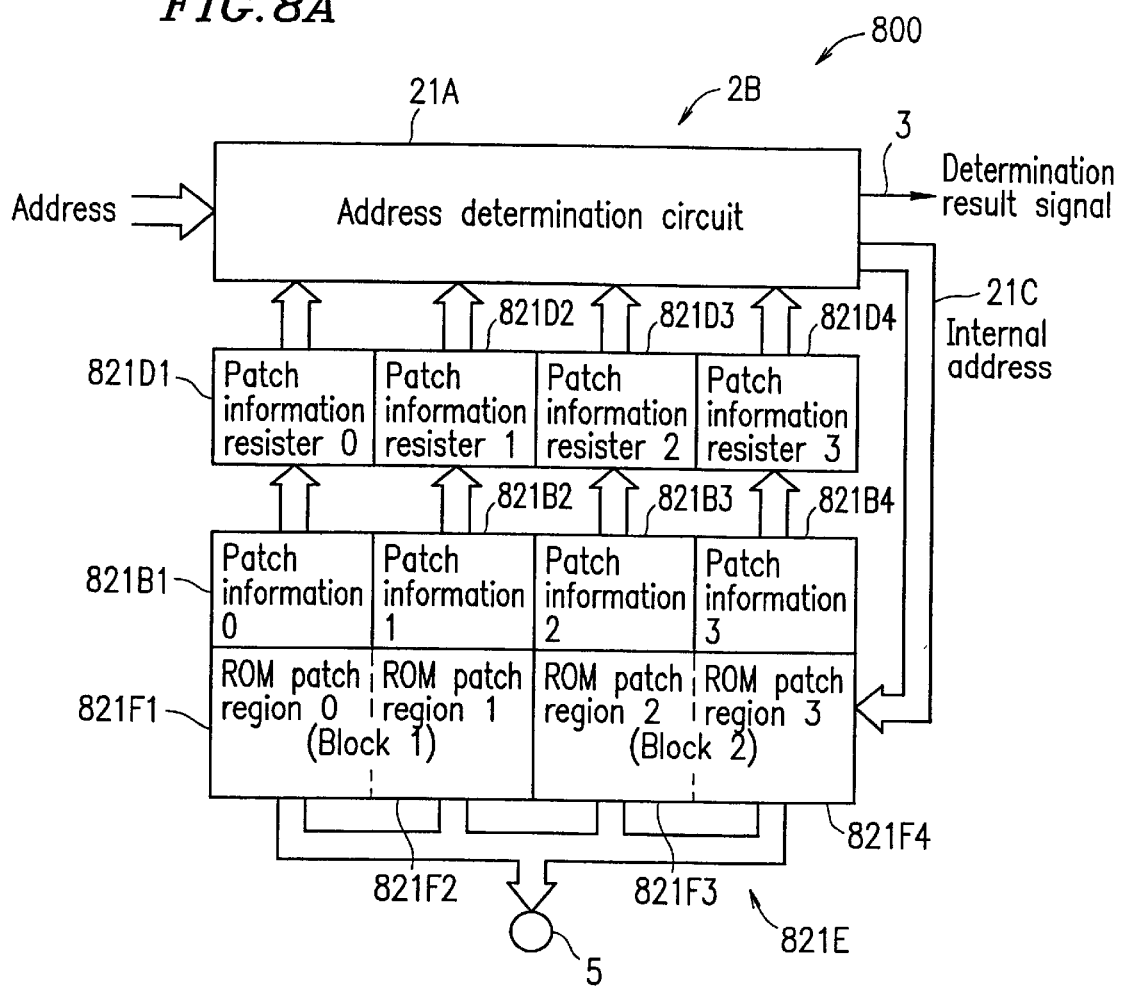
FIG. 8A is a block diagram showing a nonvolatile semiconductor memory device used in a fourth exemplary configuration of a semiconductor memory device according to the present invention.
Figure 8B:
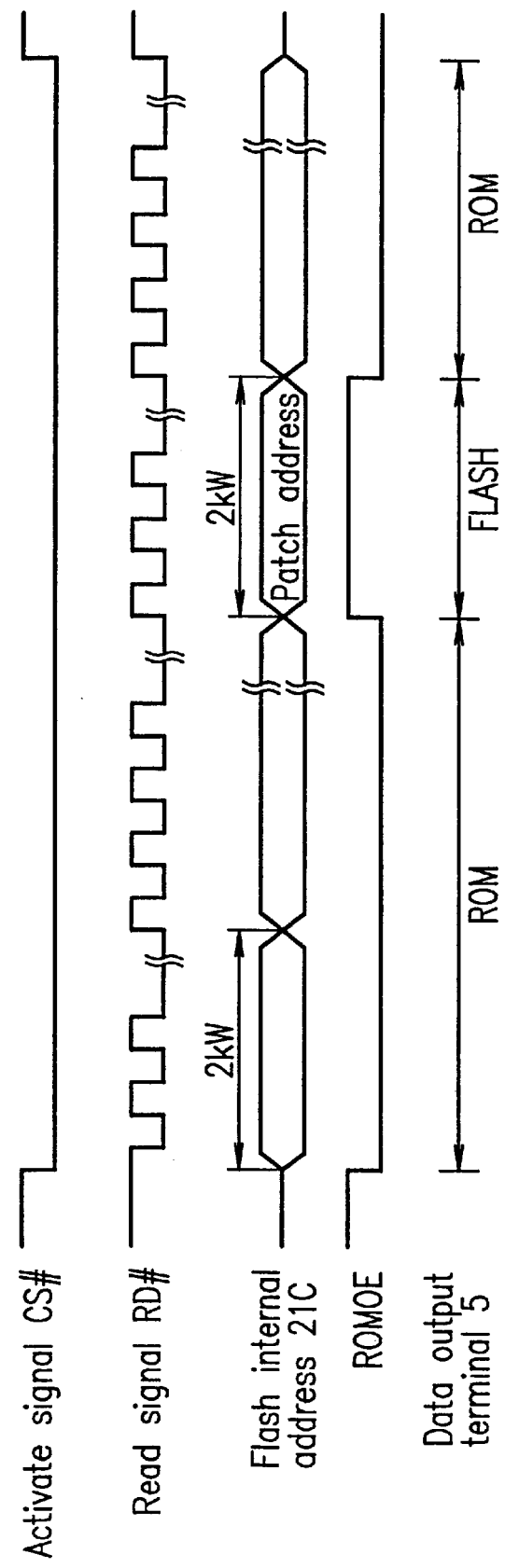
FIG. 8B is an operation timing diagram of the example in FIG. 8A.

FIGS. 8A and 8B are diagrams showing semiconductor device 800 according to the fourth example of the present invention. FIG. 8A is the block diagram of nonvolatile semiconductor memory device 2B, and FIG. 8B is an operation timing diagram of nonvolatile semiconductor memory device 2B shown in FIG. 8A. In this example, memory section 821E includes four modification data storing region 821B1, 821B2, 821B3 and 821B4, and four address data storing region 821F1, 821F2, 821F3 and 821F4. Even when four pieces of defective data occur in read-only semiconductor memory device (not shown), these four pieces of defective data can be replaced with modification data. In this example, semiconductor device 800 also includes four resisters 821D1, 821D2, 821D3 and 821D4.

In each of the foregoing examples 1 through 4, read-only semiconductor memory device 1 and nonvolatile semiconductor memory device 2 may be each formed of one-chip LSI. In this case, even when a defect occurs in read-only semiconductor memory device 1 after read-only semiconductor memory device 1 is formed, nonvolatile semiconductor memory device 2 can replace the defective data in the defective region in read-only semiconductor memory device 1 with modification data. Therefore, it is not necessary to re-design read-only semiconductor memory device 1.

Read-only semiconductor memory device 1 and nonvolatile semiconductor memory device 2 each formed of one-chip LSI may be enclosed in a same package. This may be done by using a stacked package (a single package including two chips), which looks like a single device to a user.

A semiconductor memory device according to the present invention, as described above in detail, has the following effects.

(1) A defective region of the read-only semiconductor memory device is automatically determined by an address determination circuit, and when address data written in the resistor matches address input externally, the nonvolatile semiconductor memory device outputs a determination result signal by the address determination circuit. The read-only semiconductor memory device is inactivated based on the determination result signal, and the defective data in the defective region of the read-only semiconductor memory device is replaced with modification data stored in the memory section of the semiconductor memory device. Then the modified data is output. In this manner, a high-speed operation is possible. Reduction in power consumption is also possible because of the above-described inactivation. Reduction in size is also possible because the address data of the defective region in the read-only semiconductor memory device, and the modification data for modifying the defective data are stored in the electrically writable memory section allocated in the address space, thus it is not necessary to store address data and modification data in individual memory sections. It is further possible to easily modify address data and modification data because the memory section is an electrically writable/erasable nonvolatile memory. Also, since the memory section is an electrically writable/erasable nonvolatile memory, data is not lost even after the power is turned off.

(2) Data processing can be easily executed based on the data read from the read-only semiconductor memory device or the modification data read from the nonvolatile semiconductor memory device.

(3) It is possible to check upon a final test before the shipment of the semiconductor device whether the data has been properly replaced with modification data because it is determined, by outputting a determination result signal outside the device, whether an output data is data read from read-only semiconductor memory device or modification data read from nonvolatile semiconductor memory device. Even when the replacement is carried out incorrectly, modification data and address data, which are stored in the memory section of the nonvolatile semiconductor memory device, can be properly replaced with or updated to the correct modification data.

(4) If a plurality of defective regions occur in the read-only semiconductor memory device, the plurality of pieces of data can each be replaced with modification data because the memory section includes a plurality of regions storing modification data and address data.

(5) Accidental rewrite to the modification data storing region is prevented because a protection circuit for modification data storing region is provided.

(6) It is possible to modify/update modification data only when the protection is released because the protection for modification data storing region can be released only when a voltage higher than a supply voltage (VCC) is provided as an external input signal.

(7) Accidental writing to the address data storing region is prevented because a protection circuit for address data storing region is provided.

(8) It is possible to modify/update address data only when the protection is released because the protection for address data storing region can be released only when a voltage higher than a supply voltage (VCC) is provided as an external input signal.

(9) It is possible to prevent address data from being seen by the third party. This is done by reading the address data storing region in response to a read command, then transferring the address to a resister in the nonvolatile semiconductor memory device instead of outputting outside. Providing a resister also enables one to carry out a high-speed comparison of address data and an externally input address by the address determination circuit at lower power consumption because the resister eliminates the need for always reading address data stored in the memory section.

(10) The read-only semiconductor memory device and the nonvolatile semiconductor memory device are each formed of one-chip LSI, thus it is possible for the nonvolatile semiconductor memory device to replace the defective data in the defective region in read-only semiconductor memory device with modification data even when a defect occurs in the read-only semiconductor memory device, even after the read-only semiconductor memory device is formed. Therefore, it is not necessary to re-design the read-only semiconductor memory device.

(11) It is possible to employ a stacked package (a single package including two chips), which looks like a single device to a user.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a read-only semiconductor memory device; and
   a nonvolatile semiconductor memory device for replacing defective data in at least one defective region which occurred in the read-only semiconductor memory device with modification data for modifying the defective data, the nonvolatile semiconductor memory device comprising:
      a memory section capable of electrically writing address data indicating an address of the defective region, and the modification data; and
      an address determination circuit for outputting a determination result signal which inactivates the read-only semiconductor memory device when the address data matches an address provided from outside the semiconductor memory device,
   wherein data is not read from the read-only semiconductor memory device when the address data matches the address;
   wherein the nonvolatile semiconductor memory device reads and outputs the modification data from the memory section when the address data matches the address.

2. A semiconductor memory device according to claim 1, wherein the memory section comprises:
   an address data storage region for storing the address data; and
   a modification data storage region for storing the modification data.

3. A semiconductor memory device according to claim 2, further comprising at least one modification data storing region and at least one address data storing region.

4. A semiconductor memory device according to claim 2, further comprising a circuit for protecting the modification data storing region.

5. A semiconductor memory device according to claim 4, wherein the circuit for protecting the modification data storing region releases the protection of the modification data storing region when a voltage higher than a supply voltage is applied as an external input signal.

6. A semiconductor memory device according to claim 2, wherein the nonvolatile semiconductor memory device further comprises a circuit for protecting the address data storing region.

7. A semiconductor memory device according to claim 6, wherein the circuit for protecting the address data storing region releases the protection of the address data storing region when a voltage higher than a supply voltage is applied as an input signal from outside.

8. A semiconductor memory device according to claim 1, further comprising a data processing device connected to an output of the read-only semiconductor memory device and an output of the nonvolatile semiconductor memory device.

9. A semiconductor memory device according to claim 1, wherein the determination result signal is output outside the device.

10. A semiconductor memory device according to claim 1, wherein the nonvolatile semiconductor memory device further comprises a resister for storing the address data read from the memory section in response to an input of a read command.

11. A semiconductor memory device according to claim 1, wherein the read-only semiconductor memory device and the nonvolatile semiconductor memory device are each formed of a single-chip LSI.

12. A semiconductor memory device according to claim 11, wherein the read-only semiconductor memory device and the non volatile semiconductor memory device are each formed of a single-chip LSI and are enclosed in a same package.

13. A semiconductor memory device, comprising:
   a read-only semiconductor memory device; and
   a nonvolatile semiconductor memory device for replacing defective data in at least one defective region which occurred in the read-only semiconductor memory device with modification data for modifying the defective data, the nonvolatile semiconductor memory device comprising:
      a memory section capable of electrically writing address data indicating an address of the defective region, and the modification data; and
      an address determination circuit for outputting a determination result signal which inactivates the read-only semiconductor memory device when the address data matches an address provided from outside the semiconductor memory device,
   wherein the nonvolatile semiconductor memory device reads and outputs the modification data from the memory section when the address data matches the address, wherein the memory section comprises:
      an address data storage region for storing the address data; and
      a modification data storage region for storing the modification data; and wherein the semiconductor memory device further comprises a circuit for protecting the modification data storing region.

14. A semiconductor memory device according to claim 13, wherein the circuit for protecting the modification data storing region releases the protection of the modification data storing region when a voltage higher than a supply voltage is applied as an external input signal.

15. A semiconductor memory device, comprising:
   a read-only semiconductor memory device; and
   a nonvolatile semiconductor memory device for replacing defective data in at least one defective region which occurred in the read-only semiconductor memory device with modification data for modifying the defective data, the nonvolatile semiconductor memory device comprising:
      a memory section capable of electrically writing address data indicating an address of the defective region, and the modification data; and
      an address determination circuit for outputting a determination result signal which inactivates the read-only semiconductor memory device when the address data matches an address provided from outside the semiconductor memory device,
   wherein the nonvolatile semiconductor memory device reads and outputs the modification data from the memory section when the address data matches the address,
   wherein the memory section comprises:
      an address data storage region for storing the address data; and
      a modification data storage region for storing the modification data; and
   wherein the nonvolatile semiconductor memory device further comprises a circuit for protecting the address data storing region.

16. A semiconductor memory device according to claim 15, wherein the circuit for protecting the address data storing region releases the protection of the address data storing. region when a voltage higher than a supply voltage is applied as an input signal from outside.

* * * * *